United States Patent
Shiely et al.

(10) Patent No.: US 8,443,308 B2
(45) Date of Patent: May 14, 2013

(54) EUV LITHOGRAPHY FLARE CALCULATION AND COMPENSATION

(75) Inventors: James Shiely, Aloha, OR (US); Hua Song, San Jose, CA (US)

(73) Assignee: Synopsys Inc., Mountain View, CA (US)

( * ) Notice: Subject to any disclaimer, the term of this patent is extended or adjusted under 35 U.S.C. 154(b) by 0 days.

(21) Appl. No.: 13/098,495

(22) Filed: May 2, 2011

(65) Prior Publication Data

US 2012/0284675 A1  Nov. 8, 2012

(51) Int. Cl.
*G06F 17/50* (2006.01)

(52) U.S. Cl.
USPC .............. 716/51; 716/50; 716/52; 716/53; 716/54; 716/55

(58) Field of Classification Search .................. None
See application file for complete search history.

(56) References Cited

U.S. PATENT DOCUMENTS

| | | | |
|---|---|---|---|
| 6,625,802 B2* | 9/2003 | Singh et al. | 716/51 |
| 6,898,781 B2* | 5/2005 | Singh et al. | 716/51 |
| 8,039,177 B2* | 10/2011 | Uno et al. | 430/5 |
| 2004/0025140 A1* | 2/2004 | Singh et al. | 716/21 |
| 2010/0208978 A1* | 8/2010 | Terasawa et al. | 382/145 |
| 2011/0065027 A1* | 3/2011 | Inanami et al. | 430/5 |

OTHER PUBLICATIONS

Kim et al., Flare mitigation strategies in Extreme Ultraviolet Lithography, Microelectronic Engineering, pp. 738-743, Feb. 2008.*

* cited by examiner

*Primary Examiner* — A. M. Thompson
(74) *Attorney, Agent, or Firm* — Evergreen Valley Law Group, P.C.; Kanika Radhakrishnan (57) ABSTRACT

Extreme ultraviolet (EUV) lithography flare calculation and compensation is disclosed herein. A method of calculating flare for a mask for use in EUV lithography includes decomposing the flare power spectrum density (PSD) into a low frequency component and a high frequency component. Further, the method includes receiving a plurality of layouts in a flare map generator. Each of the plurality of layouts corresponds to a chip pattern location on the mask. Moreover, the method includes generating, using the flare map generator, a low frequency flare map for the mask from the low frequency component by using fast Fourier transform (FFT).

20 Claims, 5 Drawing Sheets

EUV LITHOGRAPHY FLARE CALCULATION AND COMPENSATION

TECHNICAL FIELD

Embodiments of the disclosure relate to flare calculation and compensation for extreme ultraviolet (EUV) lithography.

BACKGROUND

As critical dimension (CD) of integrated circuit (IC) devices shrinks to 22 nm and below, extreme ultraviolet (EUV) lithography is becoming a leading technology for IC manufacturing. However, EUV lithography poses new challenges on electronic design automation (EDA) mask synthesis tools. Flare, or stray light due to mirror surface roughness on the mask, is one main concern for modeling and automatic mask synthesis. For example, the CD variation due to the flare can be over 10% of an intended CD. Thus, EDA mask synthesis tools should accurately model and correct for such flare effects.

SUMMARY

An example of a method of calculating flare for a mask for use in extreme ultraviolet (EUV) lithography includes decomposing a flare power spectrum density (PSD) into a low frequency component and a high frequency component. Further, the method includes receiving a plurality of layouts in a flare map generator, wherein each of the plurality of layouts corresponds to a chip pattern location on the mask. Moreover, the method includes generating, using the flare map generator, a low frequency flare map for the mask from the low frequency component by using fast Fourier transform (FFT).

An example of an apparatus for calculating flare for a mask for use in extreme ultraviolet (EUV) lithography mask synthesis includes one or more processors. The apparatus also includes logic encoded in one or more tangible media for execution by the one or more processors. The logic when executed is operable to decompose the flare PSD into a low frequency component and a high frequency component, to receive a plurality of layouts in a flare map generator, wherein each of the plurality of layouts corresponds to a chip pattern location on the mask, and to generate, using the flare map generator, a low frequency flare map for the mask from the low frequency component by using fast Fourier transform (FFT).

An example of a computer-readable storage medium having software encoded thereon for execution by one or more processors for calculating flare for a mask for use in extreme ultraviolet (EUV) lithography mask synthesis includes one or more instructions. The one or more instructions decompose the flare PSD into a low frequency component and a high frequency component. Further, the one or more instructions receive a plurality of layouts in a flare map generator. Each of the plurality of layouts corresponds to a chip pattern location on the mask. Moreover, the one or more instructions generate, using the flare map generator, a low frequency flare map for the mask from the low frequency component by using fast Fourier transform (FFT).

BRIEF DESCRIPTION OF THE DRAWINGS

In the accompanying figures, similar reference numerals may refer to identical or functionally similar elements. These reference numerals are used in the detailed description to illustrate various embodiments and to explain various aspects and advantages of the present disclosure.

DETAILED DESCRIPTION OF THE EMBODIMENTS

Flare, or stray light due to mirror surface roughness on a mask, is considered a relatively long range effect in extreme ultraviolet (EUV) lithography. Electronic design automation (EDA) tools can be used to simulate whether various patterns on a mask can be printed on a wafer correctly for EUV lithography. Accordingly, various physical and chemical effects, for example flare, as well as optical effects, can be determined as part of synthesizing the mask. While optical effects are generally short range effects, flare is a relatively long range effect, in terms of distance from a given evaluation point. As a result, simulating the effects of flare for appropriate correction can utilize an entire reticle or mask layout, resulting in a full reticle flare map.

In particular embodiments, such a flare map can be calculated in advance of other corrective flows. For example, a flare map can be calculated in advance of an optical proximity correction (OPC) step. Values from the calculated flare map can then be read during the OPC process for correction of the mask layout patterns. In such a manner, compensation for any expected flare for the full reticle can be accommodated. Further, particular embodiments provide both a fast and accurate flare solution that assures good correction quality.

Figure 1A:
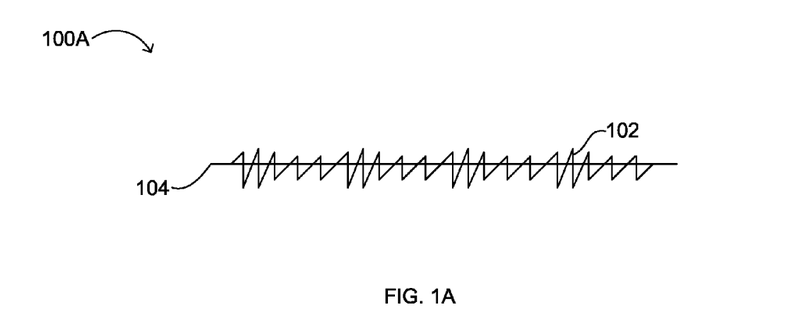
FIG. 1A illustrates an exemplary surface of a mask, in accordance with one embodiment.

Flare (stray light) is caused by mirror surface roughness on the surface of a mask, which produces scattered or stray light rays instead of reflected light rays during lithography using the mask. FIG. 1A illustrates an example 100A surface of a mask. In this example, a relatively flat mask or mirror surface is shown, but flare may also result from curved or non-flat portions of the mirror. However, main flare contributions may result from surface roughness on a relatively flat mirror portion. As shown, real surface 102 can be substantially rougher than ideal surface 104. Such roughness is not an issue for standard or older generation UV lithography applications, but is an increasing concern for more advanced applications, such as EUV lithography.

Figure 1B:
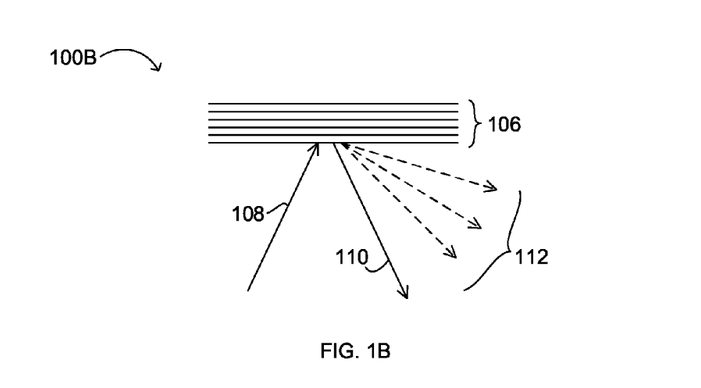
FIG. 1B illustrates an exemplary ray scattering off a surface of a mask, in accordance with one embodiment.

FIG. 1B illustrates an example 100B ray scattering off a surface of a mask. Here, incident ray 108 hits a surface of mask 106, and produces reflected ray 110, as well as scattered rays 112. The scattered rays 112 (indicated by dashed lines) may be substantially weaker in intensity relative to the reflected ray 110. The scattered rays 112 represent the stray light that produces a flare effect. Flare is a full reticle effect in that a relatively small area of surface roughness on the mask can produce a relatively wide range flare effect. For example, unlike traditional optical and/or resist effects that have an influence range of about 1 μm, a flare influence range can be as large as about 40 mm, which exceeds the size of many EUV reticles. Thus, particular embodiments provide for a full reticle calculation or mapping of the flare effects.

However, some approaches to reticle flare map calculation are extremely time-consuming For example, a commonly used space domain approach can be slower and/or less accurate as compared to the approach of certain embodiments, which provide a relatively fast and accurate approach for full reticle flare calculation and compensation. Such space domain approaches involve separating components for flare calculation based upon distances from an evaluation point.

Figure 1C:
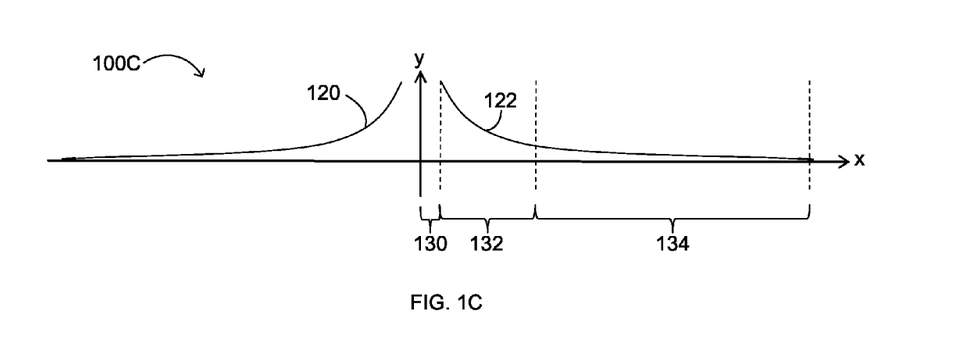
FIG. 1C illustrates an exemplary flare power spectrum density (PSD), in accordance with one embodiment.

Referring now to FIG. 1C, illustrated is an example 100C flare power spectrum density (PSD). The flare PSD represents a convolution kernel/function that models the flare effects around an evaluation point on the mask. Such a flare PSD can be determined by sampling various data, for example roughness measurements, related to mask production and/or test wafer fabrication using such a mask. For example, test patterns on test masks can be used for fabrication of test wafers that are then used for modeling by way of forming appropriate flare PSD functions. The flare PSD function then represents a predictive flare contribution characteristic relative to a given evaluation point (at the y-axis). The x-axis represents a distance from an evaluation point on the reticle for evaluating a particular flare effect, and the y-axis represents a contribution of that effect by that distance point. In a space domain approach, flare PSD functions 120/122 can be decomposed based on distances or the space from the evaluation point. For example, sections 132 and 134 can represent different space domain sections, while section 130 represents a space from the evaluation point absent a substantial flare contribution, or an otherwise asymptotically predicted contribution.

However, due to sharp cutoffs at the edges of these space domain sections, fast Fourier transform (FFT) is not used in calculating a flare from such PSD due to possible aliasing errors. As such, a space domain convolution can be used, with aggressively larger grid sizes for PSD segments away from the center, in order to speed up such a flare calculation. However, a resulting flare is not interpolated accurately because it is not sampled according to the Nyquist criterion.

Because of the roughness of the mirror or mask surface, the scattered rays 112 can occur at any point on the mask, for example UV mirror and modulated mirror. Convolution is a statistical way to calculate these effects. Because the rays can scatter relatively far away, the long tail on the flare PSD functions 120/122 is found, representing minimal but still significant flare effects at relatively long distances from the evaluation point. Also, the flare PSD functions 120/122 represents a slice of the rotationally symmetric PSD function which is a function of spatial coordinates (x, y).

Figure 2:
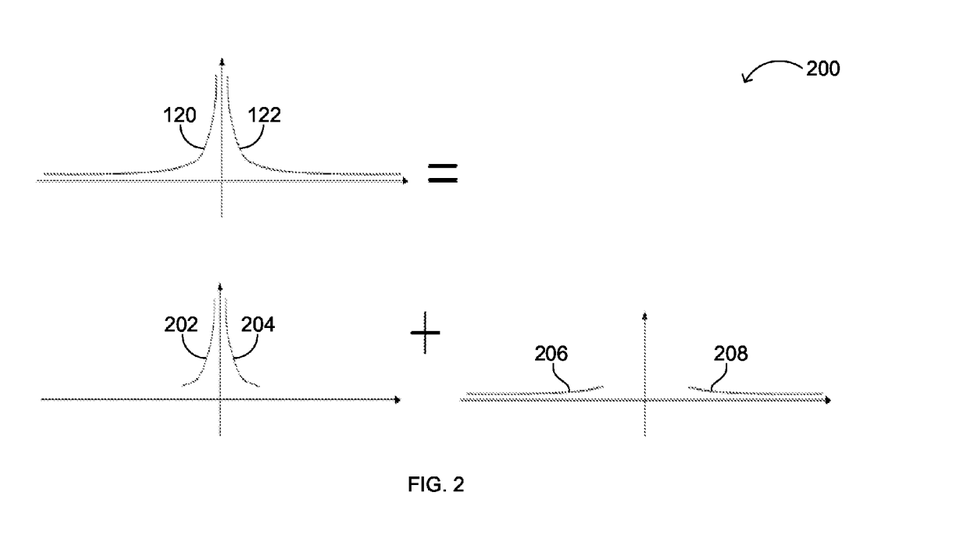
FIG. 2 illustrates an exemplary space domain separation of the flare PSD, in accordance with one embodiment.

Referring now to FIG. 2, illustrated is an example 200 space domain separation of the flare PSD. Such a space domain calculation does not use FFT because the sharp edge of the cut-off from each section does not allow. As shown, the flare PSD functions 120/122 can be split into multiple parts, such as first parts 202/204 closer to the evaluation point, and second parts 206/208 farther away from the evaluation point. In one approach, the second parts or flat long range parts 206/208 can use less accurate or large grids in order to reduce the overall flare calculation time. As such, either a lot of memory or smaller grid size can be needed to improve the accuracy of the calculation. In any event, a substantial amount of time, such as even a few days runtime in some cases, can be needed to finish the flare calculation in such an approach.

Thus, flare calculation is a computationally demanding task. The calculation involves convolving an entire reticle with the flare PSD. The flare PSD can have a domain comparable to or larger than the size of the reticle itself in order to account for across-field and across-wafer flare. With a typical EUV reticle size, for example 33 mm×26 mm, and high frequencies in the flare PSD, Nyquist sampling theory demands a sub-micron sampling grid size, which can make the computation too memory demanding to be feasible. Typically, the convolution is divided into "short range" and "long range" parts as shown in FIG. 2. In some cases, a "mid range" part in between the short and long range parts is also used in the space domain approach, along with increasing sampling grid sizes with the increasingly longer ranges. However, such an approach is still too slow to be used in production EUV mask synthesis flows. In addition, the grid size selection in such an approach is mostly by trial-and-error and lacking in theoretical rigorousness. Accordingly, FFT cannot be safely used to speed up flare calculation without concerns of possible aliasing errors.

In particular embodiments, sampling theory and FFT can be employed to assure both speed and accuracy. The approach is relatively fast, for example less than about 1 hour runtime, and suitable for full reticle flare effect correction. Certain embodiments involve decomposing the flare PSD into low frequency and high frequency parts. However, additional decompositions within the frequency domain (for example, low, medium, and high frequency parts, or any suitable number of frequency-based divisions) can also be accommodated in particular embodiments. Since the PSD is relatively smooth and flat away from the center or evaluation point, the high frequency part is very small away from the center, and can thus be accurately approximated by a short range, for example about 1 μm, based function.

The low frequency PSD can be convolved with the mask patterns and sampled with a relatively large grid size, for example about 1 μm. The high frequency PSD can be convolved with the mask patterns with a relatively small grid size, for example 10 nm, and both following the Nyquist criterion. In addition, the low frequency flare map can support fast and accurate interpolation as the low frequency flare map is properly sampled following the Nyquist criterion.

Figure 3:
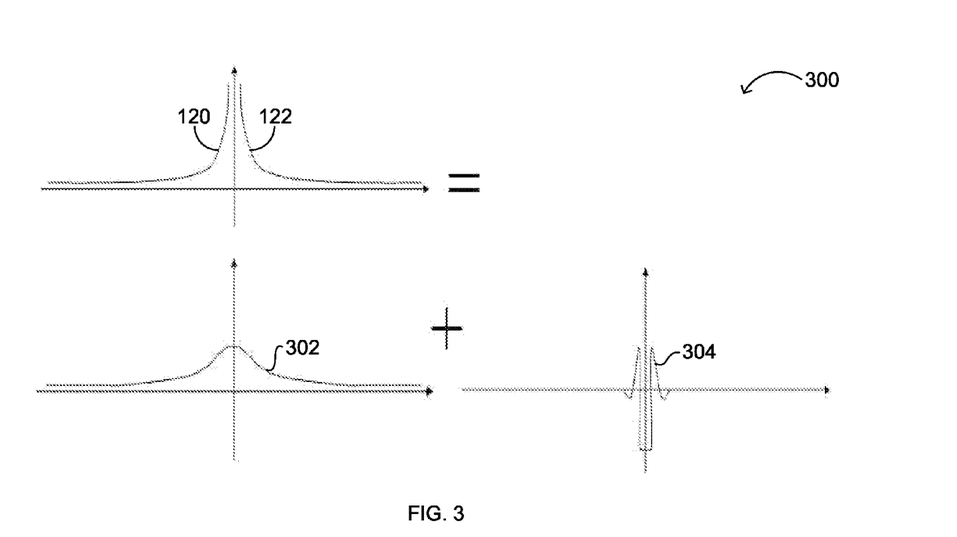
FIG. 3 illustrates an exemplary frequency domain decomposition of the flare PSD, in accordance with one embodiment.

Referring now to FIG. 3, illustrated is an example 300 frequency domain decomposition of the flare PSD, in accordance with one embodiment. In the example 300, the flare PSD functions 120/122 can be decomposed or separated into low frequency portion 302 and high frequency portion 304. The relatively smooth low frequency portion 302 inlcudes a long tail indicating reduced contribution farther away from the evaluation point. In contrast, the high frequency portion 304 represents a rough or ragged type of curve predicting short range flare effects about the evaluation point.

Particular embodiments are based on a frequency domain separation of the flare PSD into a low frequency PSD component, for example the low frequency portion 302, and a high frequency PSD component, for example the high frequency portion 304. For the low frequency component, Nyquist theory not only allows relatively large sampling grid size to be used, but also assures that FFT can be safely used to generate the low frequency flare. For the high frequency component, the "kernel" or component has a much smaller domain due to some intrinsic characteristics of the flare PSD, hence much smaller grid size can be used here. The total flare PSD is the sum of the high frequency flare PSD and the low frequency flare PSD. Further, any suitable number of frequency-based divisions can be employed in particular embodiments.

Particular embodiments can be inserted into an existing mask synthesis flow to compensate for CD variation due to flare in EUV lithography, thus leading to improved integrated circuit (IC) yield. In addition, particular embodiments are not limited strictly to EUV lithography applications, but are also suitable for use in other areas, such as e-beam direct write (EBDW) lithography, mask error correction (MEC), and density effect modeling in etching simulation, to name a few.

Certain embodiments advantageously consider that the high frequency part of the PSD is what prevents the full-reticle flare map from being calculated efficiently (in terms of both memory usage and runtime) in other approaches. Thus, particular embodiments generate the low frequency flare for the full reticle or mask, while leaving the high frequency part to the stage where only a small pattern is dealt with for correction or verification, and much smaller grid sizes can be used. Thus, a full reticle low frequency flare map can be calculated as a convolution between the reticle layout and the low frequency flare PSD by using FFT. Further, such low frequency flare map calculation can be performed before mask correction, for example for OPC.

Low frequency flare values can then be looked up or directly read from the flare map during simulation for correction or verification, and added to optical signals for appropriate correction and/or compensation. High frequency flare values can be calculated as a convolution between the chip layout and the high frequency PSD at simulation time, just like other short range effect calculations. Because FFT can be tens of thousands of times faster than space domain convolution, such a frequency-domain approach can result in overall reduced processing time. Further, any suitable non-FFT approach can be utilized for the high frequency component.

High frequency flare values can also be added to optical signals, such as for OPC. Hence, both long range effects and short range flare effects can fully be included in wafer image simulation, hence taken into account in mask correction and lithography verification.

More details in the approach of particular embodiments are shown below in Equations 1-6. Theoretically, flare-impacted optical intensity is calculated as shown below in Equation 1.

$$I(x,y) = (1-TIS)*I_0(x,y) + I_0(x,y) \otimes PSD(x,y) \quad (1)$$

In Equation 1, TIS represents the total integrated scatter (volume of the PSD), and $T_0$ is the flare-free optical intensity. The second term on the right hand side of Equation 1 represents flare, which is commonly approximated as shown below in Equation 2.

$$Flare(x,y) \approx M(x,y) \otimes PSD(x,y) \quad (2)$$

In Equation 2, M represents the design intent layout's transmission function. One aspect of particular embodiments is the fast and accurate calculation of Flare(x, y). Along these lines, the PSD is decomposed into low-frequency (LF) and high-frequency (HF) parts, as shown below in Equation 3.

$$PSD = PSD_{LF} + PSD_{HF} \quad (3)$$

For example, $PSD_{LF}$ can be determined first, as shown below in Equation 4.

$$PSD_{LF} = PSD \otimes flare\_PSD\_AA\_filter \quad (4)$$

For example, flare_PSD_AA_filter can represent an anti-aliasing filter, for example a windowed sinc function, with a cutoff frequency determined by a tradeoff between a reasonably large flare map grid size and the domain size of the residual—the high frequency component, as shown below in Equation 5.

$$PSD = PSD - PSD_{LF} \quad (5)$$

Now, the flare can be calculated as shown below in Equation 6.

$$Flare(x,y) \approx M(x,y) \otimes PSD_{LF}(x,y) + M(x,y) \otimes PSD_{HF}(x,y) \quad (6)$$

The low frequency component of the flare PSD, $PSD_{LF}$, can have a domain size (ambit) comparable to that of the original PSD. The low frequency flare=$M(x,y) \otimes PSD_{LF}(x,y)$ can be calculated by using FFT once the mask M and $PSD_{LF}$ are discretized according to the bandwidth of $PSD_{LF}$ and the Nyquist criterion. Further, the low frequency flare values for the full reticle can be saved to a low frequency flare map file for later use in model calibration, mask synthesis, and/or verification.

The high frequency component of the flare PSD, $PSD_{HF}$, can have a domain size (ambit) about or less than 1 μm. For example, the high frequency flare=$M(x,y) \otimes PSD_{HF}(x,y)$ can be calculated in substantially the same way as the other short range effects, such as optical and resists effects, with which most modeling tools are equipped.

Figure 4:
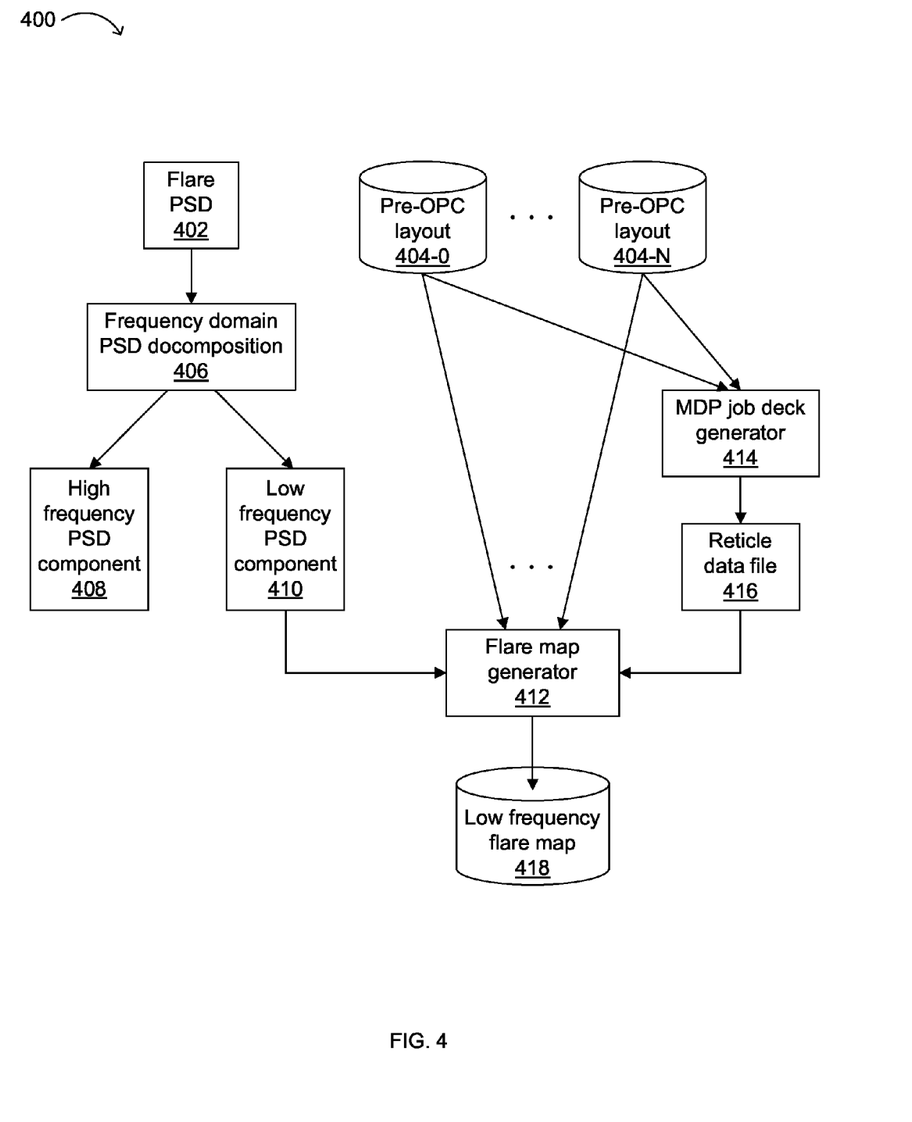
FIG. 4 illustrates a flow diagram of a flare map creation example, in accordance with one embodiment.

Referring now to FIG. 4, illustrated is a flow diagram 400 of a flare map creation example, in accordance with one embodiment. Flare PSD 402 can be decomposed in the frequency domain (406) to produce a high frequency flare PSD component 408 and a low frequency flare PSD component 410. These flare PSD components 408 and 410 can be "kernels" or mathematical functions, such as convolution kernels. For example, the low frequency flare PSD component 410 can be represented as flare PSD component 302, and the high frequency flare PSD component 408 can be represented as flare PSD component 304.

Pre-OPC layouts 404-0 through 404-N can represent different chip patterns or instances located on the mask or reticle. For example, N+1 different chip patterns can be found on the mask undergoing flare modeling and correction. Any suitable number of chip patterns or instances of a same chip pattern can be accommodated on the mask. The pre-OPC layouts 404-0 through 404-N for the different chips can be pasted or otherwise collected for modeling of the reticle itself. Mask data preparation (MDP) job deck creation tool or generator 414 can receive the pre-OPC layouts 404-0 through 404-N, and create the job deck or reticle data file 416 therefrom. For example, the reticle data file 416 can specify placement and orientation of each chip, for example 20-30 chips/instances, on the reticle. Job deck or the reticle data file 416 can also include any other suitable information related to individual chip layout characteristics relative to the mask or reticle. As such, the job deck or the reticle data file 416 can be used to convey a full reticle layout for the calculation or generation of low frequency flare map 418 to determine information on each chip layout on the reticle. Flare map generator 412 can then utilize FFT, in addition to other calculations or functions, to produce or generate the low frequency flare map 418.

A full reticle low frequency flare map can hence be calculated using pre-OPC layouts before any chip correction, for example OPC, is performed. During chip correction, low frequency flare values can be looked up or read from the low frequency flare map, and appropriately added to the optical intensity. As will be discussed in more detail below with reference to FIG. 5, the high frequency flare portion can be calculated "on-the-fly" and added to the optical intensity during the OPC calculation, which predicts the optical signal at each point in a short range determination. The high frequency portion is thus calculated during the OPC correction process, which does other calculations as to short range effects. Thus, the flare effect can be automatically compensated as part of, or otherwise integrated with, the OPC flow, or any other such short range determination.

Figure 5:
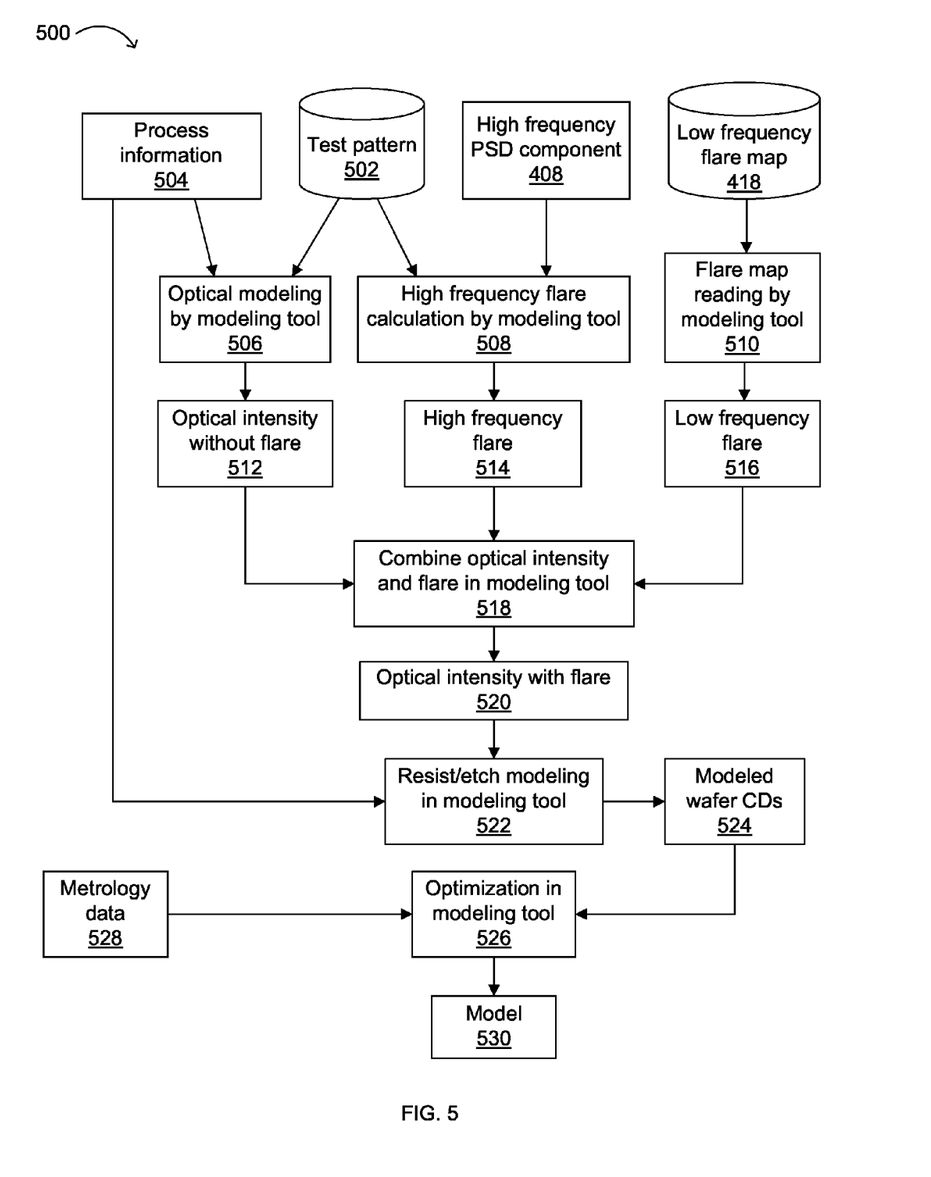
FIG. 5 illustrates a flow diagram of a model calibration example, in accordance with one embodiment.

Referring now to FIG. 5, illustrated is a flow diagram 500 of a model calibration example, in accordance with one embodiment. In the model calibration example, the low frequency flare map 418 for modeling is for a test reticle. However, the low frequency flare map 418 may also be determined for a non-test or real reticle. Using test pattern 502, tests can be run and measurements made in order to build a mathematical model as to the fabrication process, for example using process information 504. For example, metrology data 528 can include data about wafers fabricated using test reticles, such as critical dimensions (CDs) of lines/patterns formed on the wafer itself. Process information 504 can be particularly important for OPC calculations, and can include any suitable process-related data, for example optical system settings, photoresist properties, and etching characteristics, based on the particular semiconductor manufacturing process (for example, EUV lithography) that is to be used to fabricate chips based on patterns found in the mask.

Figure 6:
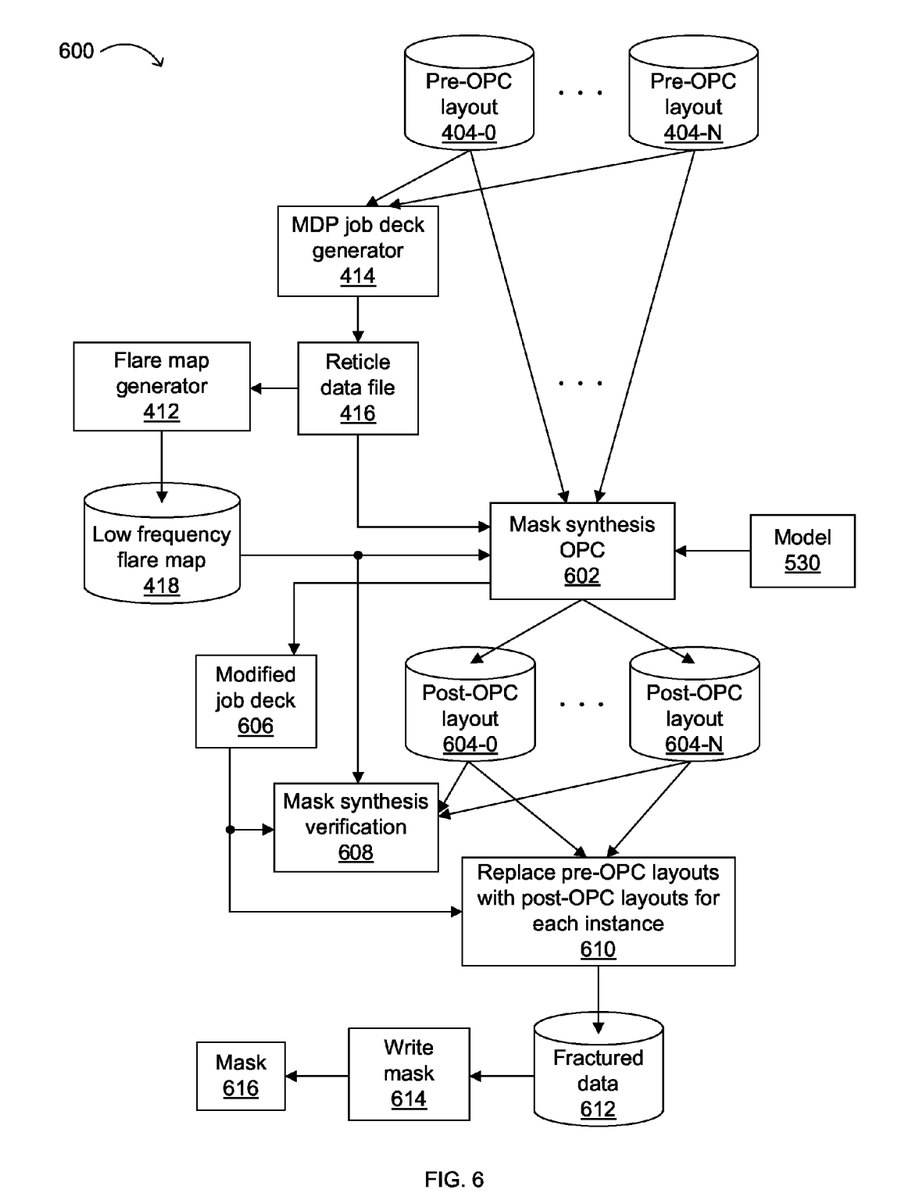
FIG. 6 illustrates a flow diagram of a mask synthesis and data preparation example, in accordance with one embodiment.

The example of FIG. 5 is used to determine a mathematical model for flare and optical effects, which may be based on measurements from a test wafer. The example of FIG. 6 below shows an actual OPC or correction flow whereby the flare map is recalculated for fabrication of the chips. FIG. 6 represents a correction flow that actually changes the layout so that layout patterns on the mask can compensate for predicted flare, as well as other effects. Thus, the flare map used in FIG. 6 is for real chips, while the flare map, for example the low frequency flare map 418, in FIG. 5 can be determined for a test reticle. The low frequency flare map 418 may also be determined for a real or non-test reticle.

In the model calibration flow example of FIG. 5, the modeling tool can perform flare map reading (510) of the low frequency flare map 418, for example of a test reticle, to produce low frequency flare 516. For example, data values representing flare at each appropriate point on the reticle can be accessed by reading the low frequency flare map 418. The high frequency flare PSD component 408 and test pattern 502 can be accessed by high frequency calculation 508 of the modeling tool to produce high frequency flare 514. Test pattern 502 and process information 504 can be accessed for optical modeling 506 by the modeling tool to produce optical intensity without flare 512. For example, optical intensity without the flare 512 may be used to determine correction suitable for OPC operations.

Optical intensity and flare (both high and low frequency flare) can be combined 518 to produce optical intensity with flare 520. Thus, optical intensity with flare 520 can represent both short range predictive effects, for example high frequency flare component and optical effects for subsequent OPC, as well as long range predictive effects, for example low frequency flare component. Resist/etch modeling 522 can access the optical intensity with flare 520, along with process information 504, to produce modeled wafer CDs 524. Modeled wafer CDs 524 can thus represent predictive dimensions for various patterns on the reticle to be modeled, based on both optical and flare types of effects. Model calibration process 526 determines model parameter values such that the modeled wafer CDs 524 are as close to the metrology data 528 as possible, resulting in mask model 530.

Referring now to FIG. 6, illustrated is a flow diagram 600 of a mask synthesis and mask data preparation (MDP) example, in accordance with one embodiment. FIG. 6 shows one example of a possible corrective flow to compensate for the predicted effects of flare. Mask synthesis OPC 602, for example operating on one chip instance at a time, can receive the model 530, the low frequency flare map 418, the reticle data file 416, and the pre-OPC layouts 404-0 through 404-N. As discussed above with reference to FIG. 4, the MDP job deck generator 414 can receive the pre-OPC layouts 404-0 through 404-N to create the reticle data file 416 for use by the flare map generator 412 to generate the low frequency flare map 418. The reticle data file 416 can include information related to chip layout placements on the mask, such as specifics of chip instance placement and chip orientation.

The mask synthesis OPC 602 can produce post-OPC layouts 604-0 through 604-N from corresponding pre-OPC layouts 404-0 through 404-N. The post-OPC layouts 604-0 through 604-N can thus include layout patterns that are tested to compensate for optical effects. Here, other suitable effects based on short range determinations can also be included in certain embodiments. Mask synthesis verification 608, which can be performed, for example one chip instance at a time, can receive the post-OPC layouts 604-0 through 604-N and modified job deck 606 (from the mask synthesis OPC 602), for verification of the post-OPC layouts 604. Such verification can include any standard layout and mask pattern verification operations. The modified job deck 606 has the replacement of pre-OPC layouts with corresponding post-OPC layouts for each instance 610. For example, the modified job deck 606 can include chip instance locations and orientations for replacement chip instance layouts (for example, the post-OPC layouts 604-0 through 604-N). Once the chip instance layouts are so replaced, fractured data 612 can be formed such that the mask shop can write the mask 614 to produce the final corrected/compensated mask 616. In such a manner, the mask 616 can include layout patterns thereon that compensate for predicted effects due to flare, optical proximity, etc.

Although the description has been described with respect to particular embodiments thereof, these particular embodiments are merely illustrative, and not restrictive. For example, any type of predictive flare functions or other types of modeling can be utilized in particular embodiments. In addition, various orderings of particular operations can be varied, such as low frequency flare map generation occurring before OPC operations. Further, operations indicated as being performed one chip instance at a time (for example, the mask synthesis verification 608 and replacement of pre-OPC layouts with post-OPC layouts for each instance 610) may also be performed in a substantially parallel fashion, in whole or in part. Techniques herein can be employed for any suitable lithography process, as well as any suitable mask making, correcting, and/or modeling tools.

In the foregoing discussion, the term "circuit" means at least either a single component or a multiplicity of components, that are connected together to provide a desired function. The term "signal" means at least one current, voltage, charge, data, or other signal.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

Particular embodiments may be implemented in a computer-readable storage medium for use by or in connection with the instruction execution system, apparatus, system, or device. Particular embodiments can be implemented in the form of control logic in software or hardware or a combination of both. The control logic, when executed by one or more processors, may be operable to perform that which is described in particular embodiments.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements illustrated in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

A "processor" when used includes any suitable hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems. A computer may be any processor in communication with a memory. The memory may be any suitable processor and/or computer-readable storage medium, such as random-access memory (RAM), read-only memory (ROM), magnetic or optical disk, or other tangible media suitable for storing instructions for execution by the processor.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. A method of calculating flare for a mask for use in extreme ultraviolet (EUV) lithography, the method comprising:
   decomposing a flare power spectrum density (PSD) into a low frequency component and a high frequency component;
   receiving a plurality of layouts in a flare map generator, wherein each of the plurality of layouts corresponds to a chip pattern location on the mask; and
   generating, using the flare map generator, a low frequency flare map for the mask from the low frequency component by using fast Fourier transform (FFT).

2. The method as claimed in claim 1, and further comprising:
   creating a reticle data file from the plurality of layouts, wherein the reticle data file includes information about orientation and positioning for each chip pattern location on the mask.

3. The method as claimed in claim 2, wherein generating the low frequency flare map comprises using the reticle data file to determine information on each of the plurality of layouts.

4. The method as claimed in claim 3, and further comprising:
   modeling a high frequency flare based on the high frequency component and a test pattern;
   modeling optical intensity based on the test pattern and process information; and
   modeling a low frequency flare based on reading the low frequency flare map.

5. The method as claimed in claim 4, and further comprising:
   generating a modeled optical intensity and flare by combining the modeled high frequency flare, the modeled optical intensity, and the modeled low frequency flare.

6. The method as claimed in claim 5, and further comprising:
   modeling resist and etch using the process information; and
   generating modeled wafer critical dimensions (CDs) using the modeled resist and etch.

7. The method as claimed in claim 6, and further comprising:
   generating a mask model by optimizing model parameters using metrology data.

8. The method as claimed in claim 7, and further comprising:
   performing correction on the plurality of layouts using the mask model, the low frequency flare map, and the reticle data file.

9. The method as claimed in claim 8, wherein performing the correction comprises:
   performing optical proximity correction (OPC) and flare effect correction for the plurality of layouts; and
   replacing the plurality of layouts with a corresponding plurality of layouts having the generated OPC therein; and
   generating a modified reticle data file from the reticle data file.

10. The method as claimed in claim 9, and further comprising:
    writing the mask using the replaced plurality of layouts.

11. An apparatus for calculating flare for a mask for use in extreme ultraviolet (EUV) lithography, the apparatus comprising:

one or more processors; and logic encoded in one or more tangible media for execution by the one or more processors, and when executed being operable to:
- decompose a flare power spectrum density (PSD) into a low frequency component and a high frequency component;
- receive a plurality of layouts in a flare map generator, wherein each of the plurality of layouts corresponds to a chip pattern location on the mask; and
- generate, using the flare map generator, a low frequency flare map for the mask from the low frequency component by using fast Fourier transform (FFT).

12. The apparatus as claimed in claim 11, wherein the logic when executed is further operable to:
- create a reticle data file from the plurality of layouts, wherein the reticle data file includes information about orientation and positioning for each chip pattern location on the mask, the reticle data file being used to generate the low frequency flare map.

13. The apparatus as claimed in claim 12, wherein the logic when executed is further operable to:
- model a high frequency flare based on the high frequency component and a test pattern;
- model optical intensity based on the test pattern and process information;
- model a low frequency flare based on reading the low frequency flare map; and
- generate a modeled optical intensity and flare by combining the modeled high frequency flare, the modeled optical intensity, and the modeled low frequency flare.

14. The apparatus as claimed in claim 13, wherein the logic when executed is further operable to:
- model resist and etch using the process information;
- generate modeled wafer critical dimensions (CDs) using the modeled resist and etch; and
- generate a mask model by optimizing model parameters using metrology data.

15. The apparatus as claimed in claim 14, wherein the logic when executed is further operable to perform correction on the plurality of layouts using the mask model, the low frequency flare map, and the reticle data file, wherein performing the correction comprises:
- performing optical proximity correction (OPC) and flare effect correction for the plurality of layouts;
- replacing the plurality of layouts with a corresponding plurality of layouts having the generated OPC therein, wherein the mask is written using the replaced plurality of layouts; and
- generating a modified reticle data file from the reticle data file.

16. A computer-readable storage medium having software encoded thereon for execution by one or more processors for calculating flare for a mask for use in extreme ultraviolet (EUV) lithography, the computer-readable storage medium comprising one or more instructions for:
- decomposing a flare power spectrum density (PSD) into a low frequency component and a high frequency component;
- receiving a plurality of layouts in a flare map generator, wherein each of the plurality of layouts corresponds to a chip pattern location on the mask; and
- generating, using the flare map generator, a low frequency flare map for the mask from the low frequency component by using fast Fourier transform (FFT).

17. The computer-readable storage medium as claimed in claim 16, and further comprising one or more instructions for:
- creating a reticle data file from the plurality of layouts, wherein the reticle data file includes information about orientation and positioning for each chip pattern location on the mask, the reticle data file being used to generate the low frequency flare map.

18. The computer-readable storage medium as claimed in claim 17, and further comprising one or more instructions for:
- modeling a high frequency flare based on the high frequency component and a test pattern;
- modeling optical intensity based on the test pattern and process information;
- modeling a low frequency flare based on reading the low frequency flare map; and
- generating a modeled optical intensity and flare by combining the modeled high frequency flare, the modeled optical intensity, and the modeled low frequency flare.

19. The computer-readable storage medium as claimed in claim 18, and further comprising one or more instructions for:
- modeling resist and etch using the process information;
- generating modeled wafer critical dimensions (CDs) using the modeled resist and etch; and
- generating a mask model by optimizing the modeled wafer CDs using metrology data.

20. The computer-readable storage medium as claimed in claim 19 and further comprising one or more instructions for performing correction on the plurality of layouts using the mask model, the low frequency flare map, and the reticle data file, wherein performing the correction comprises:
- performing optical proximity correction (OPC) and flare effect correction for the plurality of layouts;
- replacing the plurality of layouts with a corresponding plurality of layouts having the generated OPC therein, wherein the mask is written using the replaced plurality of layouts; and
- generating a modified reticle data file from the reticle data file.

* * * * *